(12) United States Patent
Clark et al.

(10) Patent No.: US 7,920,409 B1
(45) Date of Patent: Apr. 5, 2011

(54) SRAM CELL WITH INTRINSICALLY HIGH STABILITY AND LOW LEAKAGE

(75) Inventors: Lawrence T. Clark, Phoenix, AZ (US); Sayeed Ahmed Badrudduza, Tempe, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 745 days.

(21) Appl. No.: 11/758,568

(22) Filed: Jun. 5, 2007

(51) Int. Cl.
*G11C 11/00* (2006.01)
(52) U.S. Cl. ............... 365/154; 365/156; 365/189.15; 365/189.16; 365/190; 365/230.05
(58) Field of Classification Search .............. 365/154, 365/156, 189.15, 189.16, 190, 230.05
See application file for complete search history.

(56) References Cited

U.S. PATENT DOCUMENTS

| 5,189,640 | A | * | 2/1993 | Huard ........................... 365/154 |
| 6,639,827 | B2 | | 10/2003 | Clark et al. |
| 6,650,589 | B2 | | 11/2003 | Clark |
| 7,532,501 | B2 | * | 5/2009 | Joshi et al. ..................... 365/154 |

OTHER PUBLICATIONS

Agawa, Ken'ici et al., "A Bitline Leakage Compensation Scheme for Low-Voltage SRAMs," IEEE Journal of Solid-State Circuits, May 2001, pp. 726-734, vol. 36, No. 5, IEEE.
Azizi, Navid et al., "Low-Leakage Asymmetric-Cell SRAM," IEEE Transactions on Very Large Scale Integration (VLSI) Systems, Aug. 2003, pp. 701-715, vol. 11, No. 4, IEEE.
Bhavnagarwala, Azeez J. et al., "Dynamic-Threshold CMOS SRAM Cells for Fast, Portable Applications," Proceedings of the IEEE International Conference on ASIC/SOC, 2000, pp. 359-363, IEEE.
Bhavnagarwala, Azeez J. et al., "The Impact of Intrinsic Device Fluctuations on CMOS SRAM Cell Stability," IEEE Journal of Solid-State Circuits, Apr. 2001, pp. 658-665, vol. 36, No. 4, IEEE.
Calhoun, Benton H. et al., "A 256kb Sub-threshold SRAM in 65nm CMOS," Proceedings of the 2006 IEEE International solid-State Circuits Conference, 2006, pp. 628-678, IEEE.
Calhoun, Benton Highsmith et al., "A 256-kb 65-nm Sub-threshold SRAM Design for Ultra-Low-Voltage Operation," IEEE Journal of Solid-State Circuits, Mar. 2007, pp. 680-688, vol. 42, No. 3, IEEE.
Cao, Yu et al., "New Paradigm of Predictive MOSFET and Interconnect Modeling for Early Circuit Simulation," Proceedings of the IEEE 2000 Custom Integrated Circuits Conference, 2000, pp. 201-204, IEEE.

(Continued)

*Primary Examiner* — Hoai V Ho
*Assistant Examiner* — Kretelia Graham
(74) *Attorney, Agent, or Firm* — Withrow & Terranova, P.L.L.C.

(57) ABSTRACT

A Static Random Access Memory (SRAM) cell having high stability and low leakage is provided. The SRAM cell includes a pair of cross-coupled inverters providing differential storage of a data bit. Power to the SRAM cell is provided by a read word line (RWL) signal, which is also referred to herein as a read control signal. During read operations, the RWL signal is pulled to a voltage level that forces the SRAM cell to a full-voltage state. During standby, the RWL signal is pulled to a voltage level that forces the SRAM cell to a voltage collapsed state in order to reduce leakage current, or leakage power, of the SRAM cell. A read-transistor providing access to the bit stored by the SRAM cell is coupled to the SRAM cell via a gate of the read transistor, thereby decoupling the stability of the SRAM cell from the read operation.

38 Claims, 11 Drawing Sheets

OTHER PUBLICATIONS

Chang, Jonathan et al., "A 130-nm Triple-Vt 9-MB Third-Level On-Die Cache for the 1.7-GHz Itanium 2 Processor," IEEE Journal of Solid-State Circuits, Jan. 2005, pp. 195-203, vol. 40, No. 1, IEEE.

Chang, Leland et al., "Stable SRAM Cell Design for the 32 nm Node and Beyond," Digest of Technical Papers from the 2005 Symposium on VLSI Technology, pp. 128-129.

Chen, Jinhui et al., "An Ultra-Low-Power Memory With a Subthreshold Power Supply Voltage," IEEE Journal of Solid-State Circuits, Oct. 2006, pp. 2344-2353, vol. 41, No. 10, IEEE.

Clark, Lawrence T. et al., "Low Standby Power State Storage for Sub-130-nm Technologies," IEEE Journal of solid-State Circuits, Feb. 2005, pp. 498-506, vol. 40, No. 2, IEEE.

Clark, Lawrence T. et al., "Managing Standby and Active Mode Leakage Power in Deep Sub-micron Design," Proceedings of the 2004 International Symposium on Low Power Electronics and Design, 2004, pp. 274-279, ACM.

Clark, Lawrence T. et al., "Reverse-Body Bias and Supply Collapse for Low Effective Standby Power," IEEE Transactions on Very Large Scale Integration (VLSI) Systems, Sep. 2004, pp. 947-956, vol. 12, No. 9, IEEE.

Clark, Lawrence T. et al., "Standby Power Management for a 0.18mm Microprocessor," Proceedings of International Symposium on Low Power Electronics and Design, 2002, pp. 7-12.

Flautner, Krisztian et al., "Drowsy Caches: Simple Techniques for Reducing Leakage Power," Proceedings of IEEE International Conference on ASIC/SOC, 2000, pp. 359-363.

Frank, David J. et al., "Device Scaling Limits of Si MOSFETs and Their Application Dependencies," Proceedings of the IEEE, Mar. 2001, pp. 259-288, vol. 89, No. 3, IEEE.

IBM Global Engineering Solutions, "IBM ASIC Solutions," 06-07, International Business Machines.

"Intel PXA27x Processor Family Power Requirements," Application Note, Order No. 280005-002, Intel.

Keshavarzi, Ali et al., "Technology Scaling Behavior of Optimum Reverse Body Bias for Standby Leakage Power Reduction in CMOS IC's," Proceeding of International Symposium on Low Power Electronics and Design, 1999, pp. 252-254, ACM.

Kim, K. J. et al., "A Novel 6.4mm2 Full-CMOS SRAM Cell with Aspect Ratio of 0.63 in a High-Performance 0.25mm-Generation CMOS Technology," Digest of Technical Papers from the 1998 Symposium on VLSI Technology, 1998, pp. 68-69, IEEE.

Krishnamurthy, Ram K. et al., "High-performance and Low-power Challenges for Sub-70nm Microprocessor Circuits," Proceedings of the IEEE 2002 Custom Integrated Circuits Conference, 2002, pp. 125-128, IEEE.

Mann, R. W. et al., "Ultralow-power SRAM Technology," IBM J. Res. & Dev., Sep./Nov. 2003, pp. 553-566, vol. 47, No. 5/6, International Business Machines Corporation.

Min, Kyeong-Sik et al., "Row-by-Row Dynamic Source-Line Voltage Control (RRDSV) Scheme for Two Orders of Magnitude Leakage Current Reduction of Sub-1-V-VDD SRAM's," Proceedings of the International Symposium on Low Power Electronics and Designs, 2003, pp. 66-71, ACM.

Mizuno, Hiroyuki et al., "An 18-mA Standby Current 1.8-V, 200-MHz Microprocessor with Self-Substrate-Biased Data-Retention Mode," IEEE Journal of Solid-State Circuits, Nov. 1999, pp. 1492-1500, vol. 34, No. 11, IEEE.

Mizuno, Hiroyuki et al., "Driving Source-Line Cell Architecture for Sub-1-V High-Speed Low-Power Applications," IEEE Journal of solid-State Circuits, Apr. 1996, pp. 552-557, vol. 31, No. 4, IEEE.

Morifuji, Eiji et al., "Supply and Threshold-Voltage Trends for Scaled Logic and SRAM MOSFETs," IEEE Transactions on Electron Devices, Jun. 2006, pp. 1427-1432, vol. 53, No. 6, IEEE.

Osada, Kenichi et al., "16.7-fA/Cell Tunnel-Leakage-Suppressed 16-Mb SRAM for Handling Cosmic-Ray-Induced Multierrors" IEEE Journal of Solid-State Circuits, Nov. 2003, pp. 1952-1957, vol. 38, No. 11, IEEE.

Qin, Huifang et al., "SRAM Leakage Suppression by Minimizing Standby Supply Voltage," Proceedings of the International Symposium on Quality of Electronic Designs, 2004, pp. 55-60, IEEE.

Seevinck, Evert et al., "Static-Noise Margin Analysis of MOS SRAM Cells," IEEE Journal of Solid-State Circuits, Oct. 1987, pp. 748-754, vol. SC-22, No. 5, IEEE.

Yamaoka, Masanao et al., "90-nm Process-Variation Adaptive Embedded SRAM Modules With Power-Line-Floating Write Technique," IEEE Journal of Solid-State Circuits, Mar. 2006, pp. 705-711, vol. 41, No. 3, IEEE.

Zhang, Kevin et al., "A 3-GHz 70-Mb SRAM in 65-nm CMOS Technology With Integrated Column-Based Dynamic Power Supply," IEEE Journal of Solid-State Circuits, Jan. 2006, pp. 146-151, vol. 41, No. 1, IEEE.

Zhang, Kevin et al., "SRAM Design on 65-nm CMOS Technology With Dynamic Sleep Transistor for Leakage Reduction," IEEE Journal of Solid-State Circuits, Apr. 2005, pp. 895-901, vol. 40, No. 4, IEEE.

Zhao, S. et al., Transistor Optimization for Leakage Power Management in a 65-nm CMOS Technology for Wireless and Mobile Applications, Digest of Technical Papers of the 2004 Symposium on VLSI Technology, 2004, pp. 14-15, IEEE.

* cited by examiner

SRAM CELL WITH INTRINSICALLY HIGH STABILITY AND LOW LEAKAGE

FIELD OF THE INVENTION

The present invention relates to a Static Random Access Memory (SRAM) cell and more specifically relates to a SRAM cell having intrinsically high stability and low leakage.

BACKGROUND OF THE INVENTION

Static Random Access Memory (SRAM) cells comprise an increasing portion of modern very large scale integrated (VLSI) circuits due to their low activity factor, which leads to low active power density, and ease of design. A conventional SRAM cell 10 is illustrated in FIG. 1. One issue with the conventional SRAM cell 10 is that current through pull-down transistors M1 or M3 when reading a logic "0" from output node N1 or N2, respectively, reduces the Static Noise Margin (SNM) of the conventional SRAM cell 10 during the read operation. More specifically, a read operation is performed by pre-charging bit lines BL and BLN to a high voltage level and the write line WL is pulled high in order to turn on access transistors M5 and M6. If a logic "0" is stored at output node N2, pull-up transistor M2 is off and pull-down transistor M1 is on. Due to the voltage division across transistors M1 and M5, the voltage at the output node N2 rises above $V_{SS}$. This rise in voltage at the output node N2 decreases the SNM during the read operation.

The rise in voltage at the output node N2 when reading a logic "0" is determined by the cell ratio of the gate size of the pull-down transistor M1 to that of the access transistor M5. The higher the cell ratio, the smaller the voltage drop across the pull-down transistor M1 and the greater the SNM of the cell. Thus, the pull-down transistor M1 must be stronger than the access transistor M5 so that a logic "0" stored at the output node N2 is not pulled high during a read operation. Similarly, the pull-down transistor M3 must be stronger than the access transistor M6 so that a logic "0" stored at output node N1 is not pulled high during a read operation. However, there is a conflicting restraint that the pull-up transistors M2 and M4 be weaker than the access transistors M5 and M6 in order to ensure write-ability, thereby constraining the design space for the conventional SRAM cell 10.

Stability is further complicated by modern highly scaled processes. More specifically, increasing mismatch due to processing and lithographic variation and even random dopant fluctuations (RDF) has made SRAM stability problematic in highly scaled processes. In addition, the source voltage $V_{DD}$ needed to ensure stability in modern highly scaled processes is becoming increasingly problematic since the PMOS source voltage $V_{DD}$ must be decreased as the size of the transistors M1-M6 in the conventional SRAM cell 10 is decreased in order to prevent destruction of the transistors M1-M6 by applying an excessive voltage across the gate oxide of the corresponding gates.

Leakage power or current is also an issue with the conventional SRAM cell 10. FIG. 2 illustrates transistor leakage components in a Metal Oxide Semiconductor (MOS) transistor. The leakage components include a drain to source leakage component ($I_{OFF}$), a direct band-to-band tunneling leakage component through the gate oxide ($I_{GATE}$), a gate induced drain leakage component ($I_{GIDL}$), and a direct band-to-band tunneling leakage component at the transistor drain to body, or bulk, interface ($I_{ZENER}$). As the size of the transistor decreases, the source voltage $V_{DD}$ applied to the transistor and thus the threshold voltage ($V_t$) of the transistor must also decrease. The reduction in the threshold voltage ($V_t$) results in an exponential increase in $I_{OFF}$, and the reduction in the power supply voltage $V_{DD}$ results in an exponential decrease of the leakage components $I_{GATE}$, $I_{GIDL}$, and $I_{ZENER}$. However, a conventional 6-T SRAM cell suffers degraded read static noise margin with reduced $V_{DD}$. This currently limits the allowable $V_{DD}$ reduction in practice.

Thus, there is a need for a SRAM cell having high stability and low leakage.

SUMMARY OF THE INVENTION

The present invention provides a Static Random Access Memory (SRAM) cell having high stability and low leakage. More specifically, the SRAM cell includes a pair of cross-coupled inverters providing differential storage of a data bit. Power to the SRAM cell is provided by a read word line (RWL) signal, which is also referred to herein as a read control signal. During read operations, the RWL signal is pulled to a voltage level that forces the SRAM cell to a full-voltage state. When the SRAM cell is not being accessed, the RWL signal is pulled to a voltage level that forces the SRAM cell to a voltage collapsed state such that the leakage current, or leakage power, of the SRAM cell is substantially reduced as compared to a conventional SRAM cell. Reverse body biasing may also be applied to further reduce the leakage current of the SRAM cell. In addition, a read-transistor providing access to the bit stored by the SRAM cell is coupled to the SRAM cell via a gate of the read transistor, thereby decoupling the stability of the SRAM cell from the read operation.

More specifically, in one embodiment, the read transistor is an n-type Metal Oxide Semiconductor (NMOS) transistor connected in a common source configuration wherein a gate of the read transistor is connected to an output node of the pair of cross-coupled inverters, a source of the read transistor is connected to an associated bit line, and a drain of the read transistor is connected to a low level voltage source. In order to perform a read operation, the bit line is pre-charged to a charged voltage level, and the RWL signal is asserted to activate the SRAM cell for the read operation. If the bit stored by the SRAM cell is a logic "0," the read transistor is off, and the bit line remains charged. If the bit stored by the SRAM cell is a logic "1," the read transistor is turned on, and the bit line is discharged to the low level voltage source through the read transistor. An inverting sense amplifier may be coupled to the bit line and operate to provide a logic "0" when the bit line remains charged when reading a logic "0" from the SRAM cell and to provide a logic "1" when the bit line is discharged when reading a logic "1" from the SRAM cell. Once the read operation is complete, the RWL signal is pulled to the voltage level that forces the SRAM cell into the voltage collapsed state for standby.

The read transistor may alternatively be a p-type Metal Oxide Semiconductor (PMOS) transistor connected in a common source configuration. As another alternative, the read transistor may be either an NMOS or PMOS transistor connected in a source-follower configuration.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 1 illustrates a conventional six transistor (6-T) Static Random Access Memory (SRAM) cell;

Figure 3:
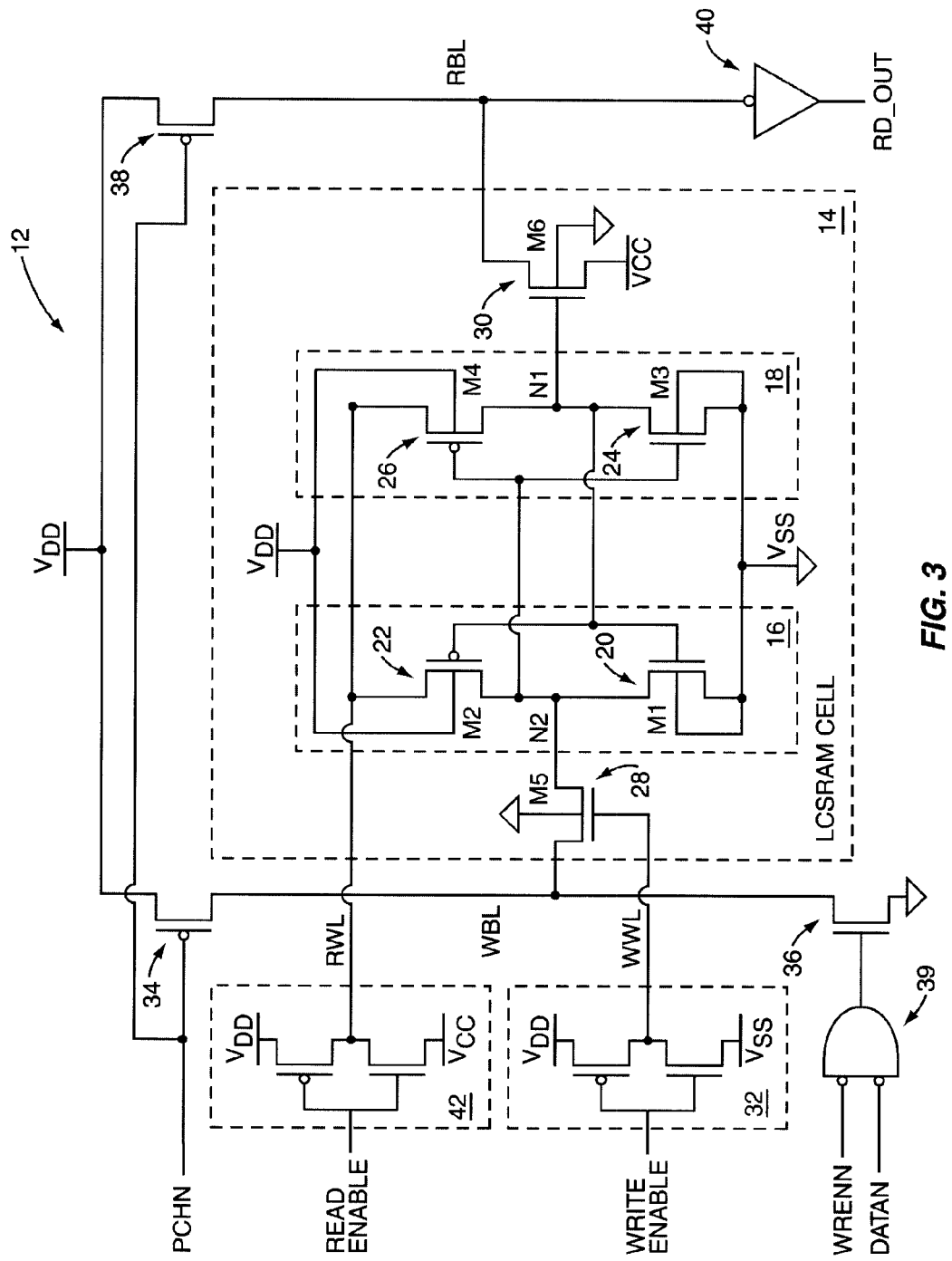
FIG. 3 illustrates a 6-T Leakage Controlled SRAM (LCSRAM) cell according to a first embodiment of the present invention.
Figure 5:
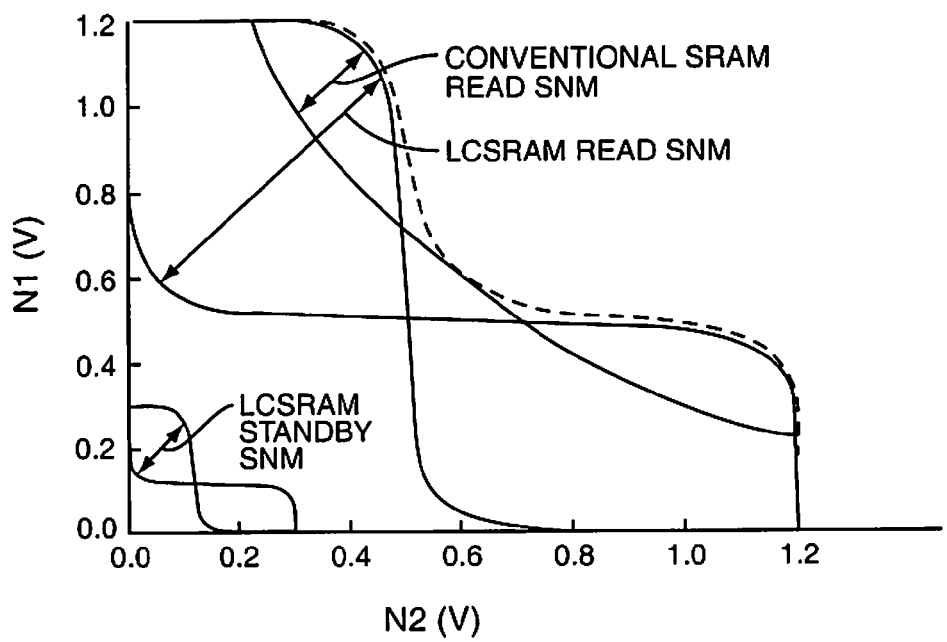
Figure 6:
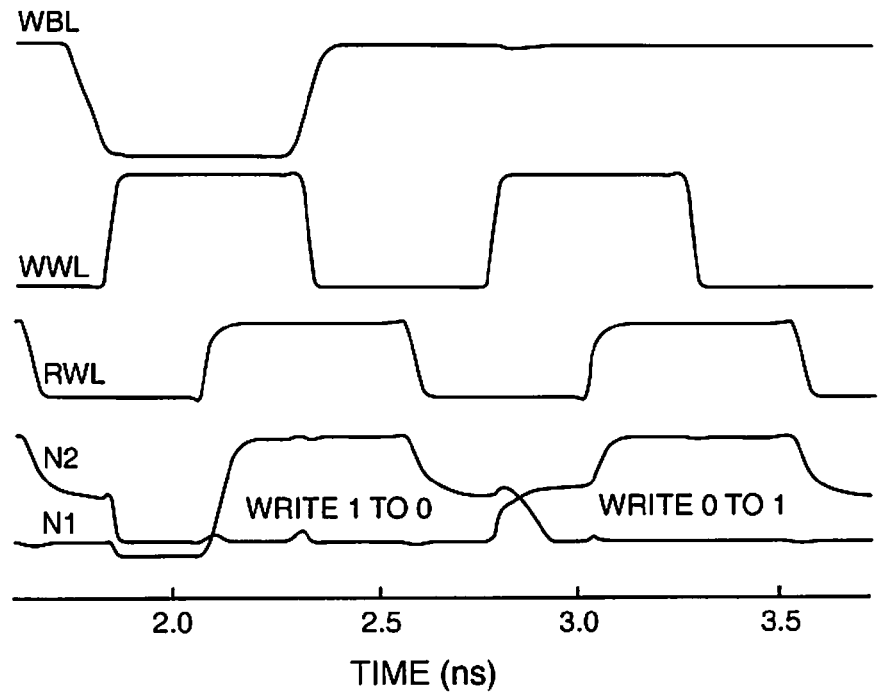
Figure 7:
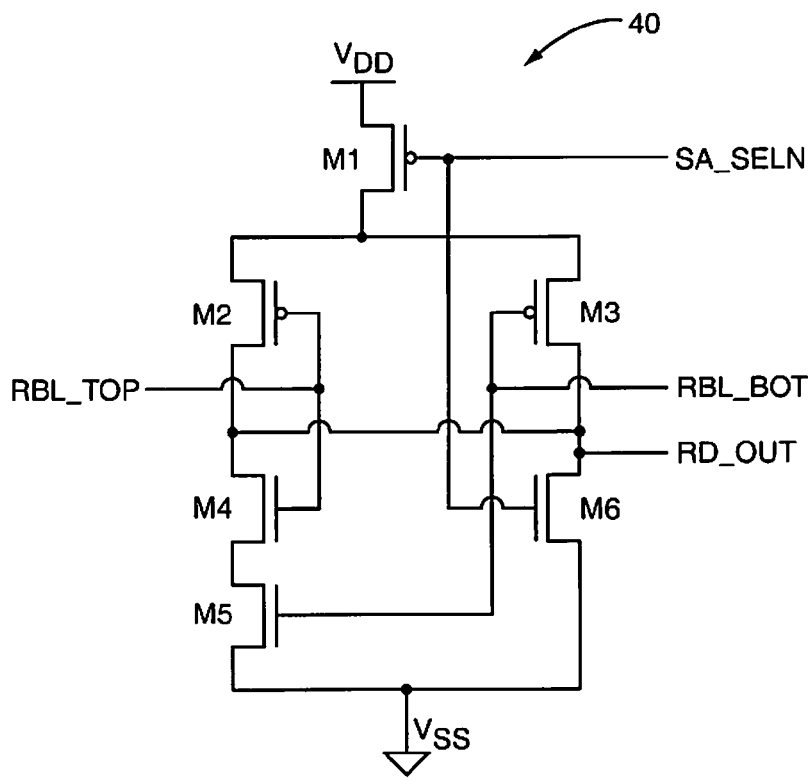
Figure 8:
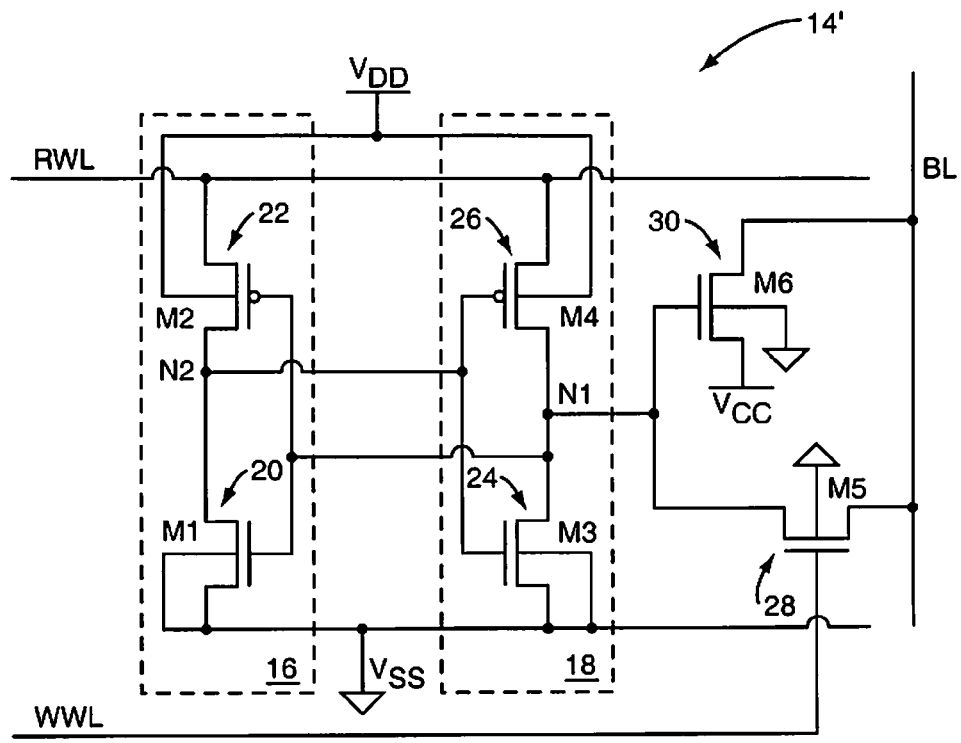
Figure 9:
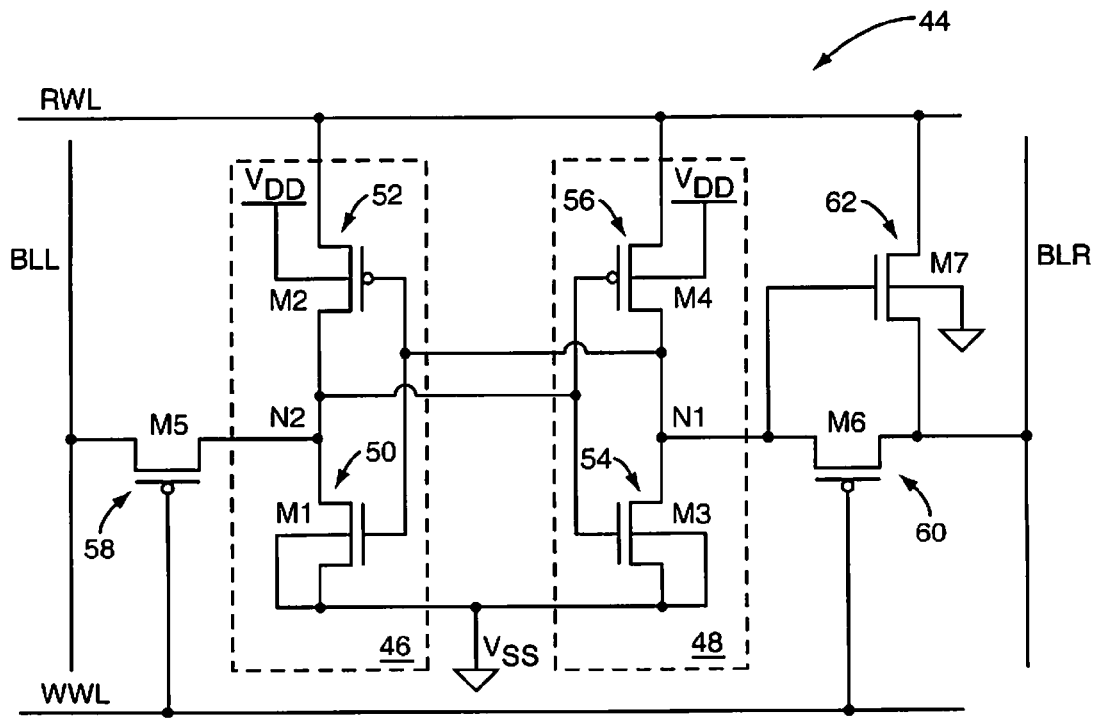
Figure 10:
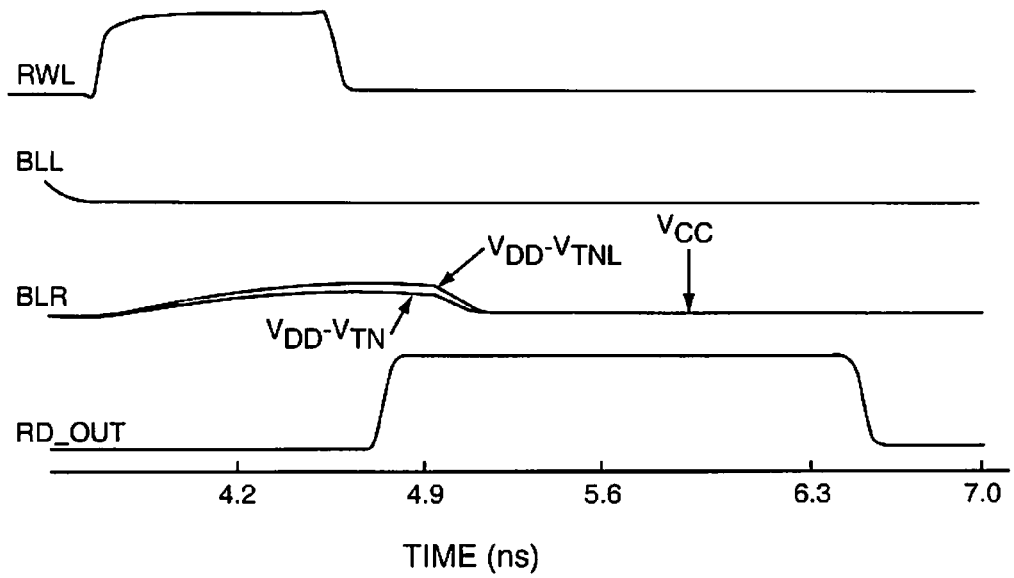
Figure 11:
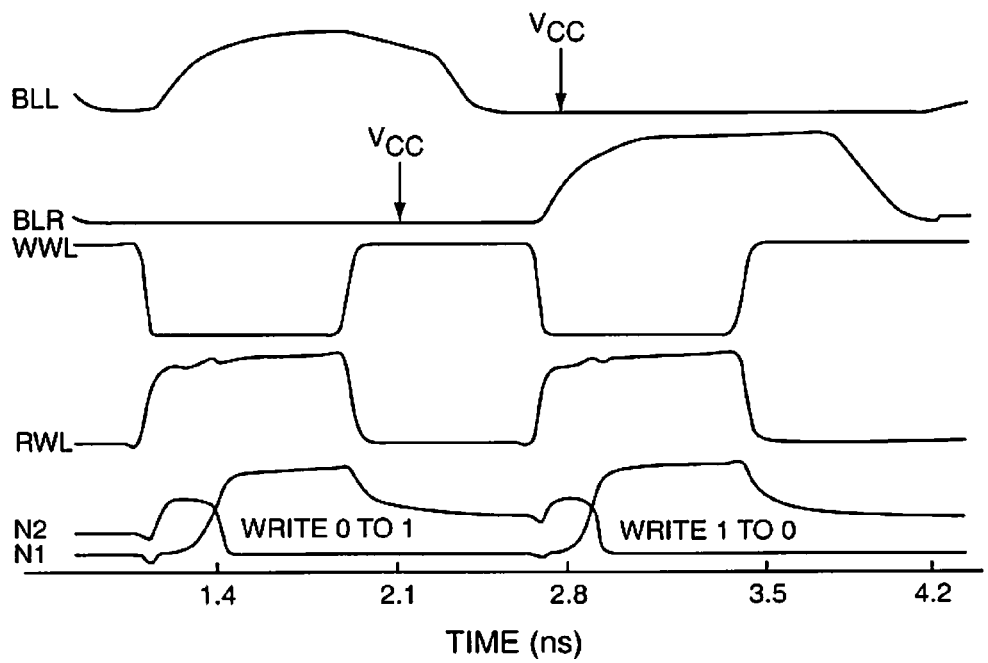
Figure 12:
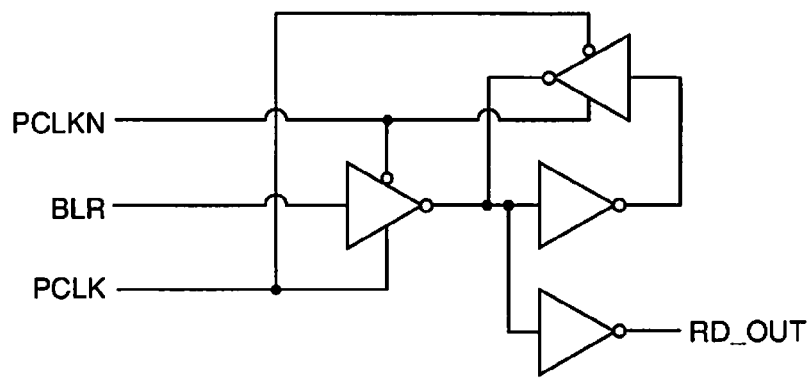
Figure 13:
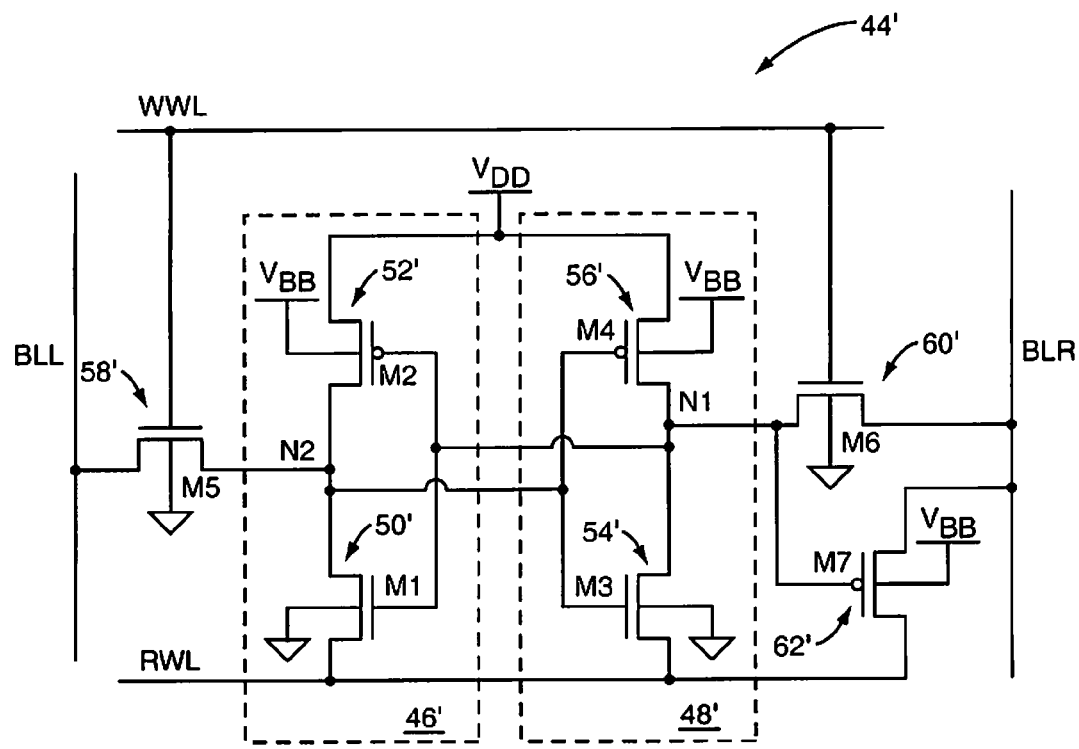
Figure 14:
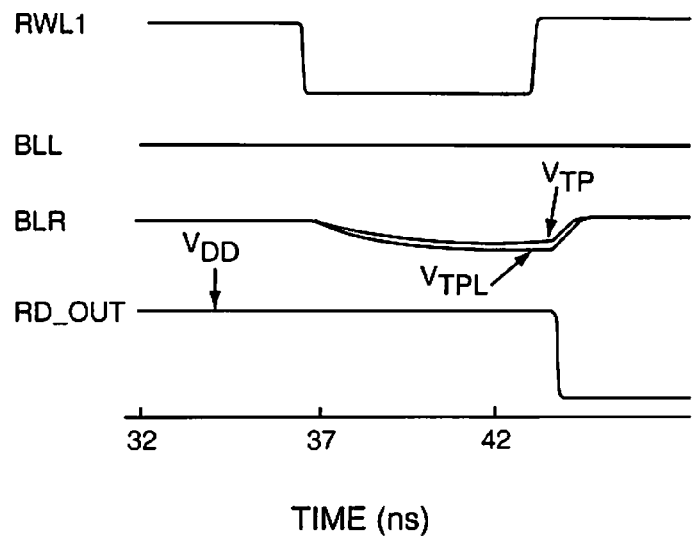
Figure 15:
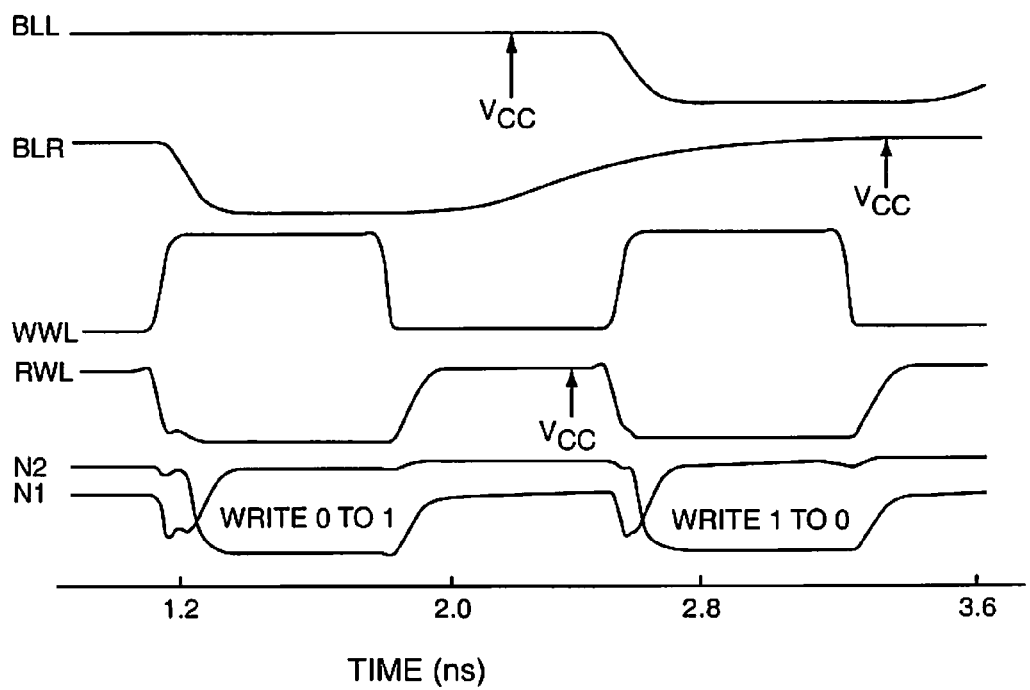
Figure 16:
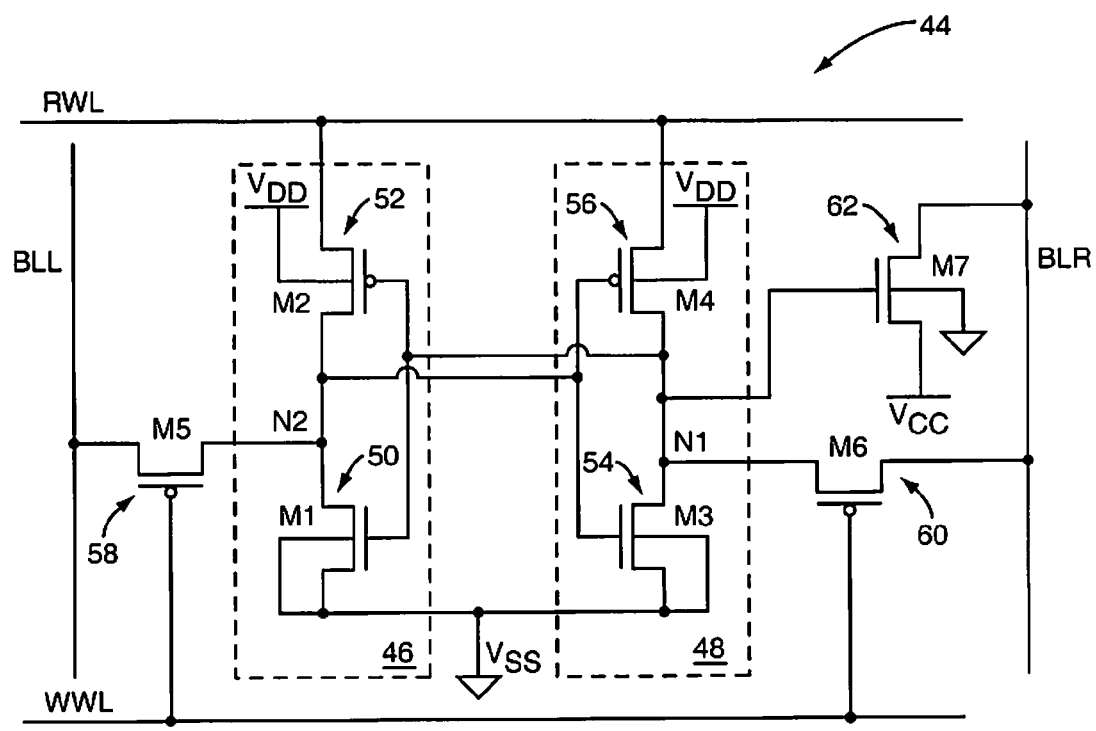
Figure 17:
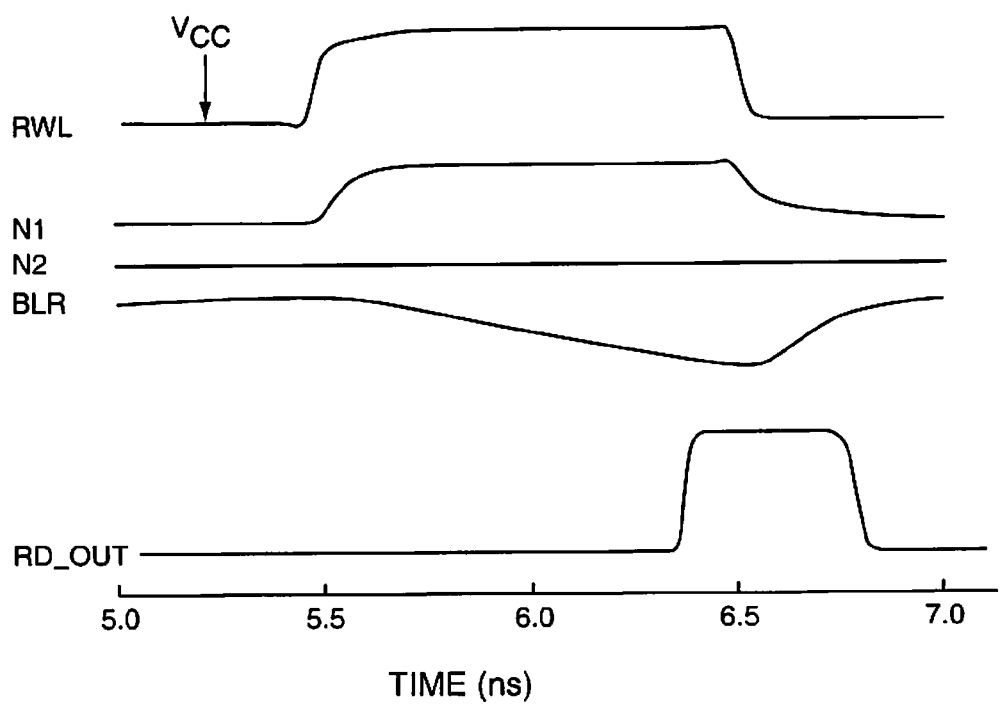
Figure 18:
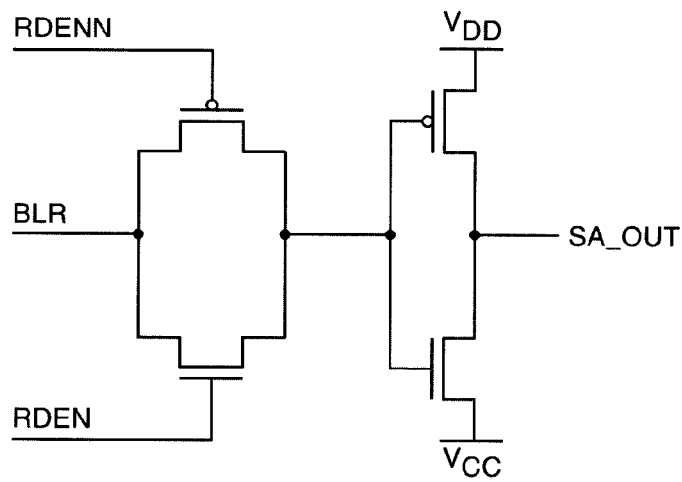
Figure 19:
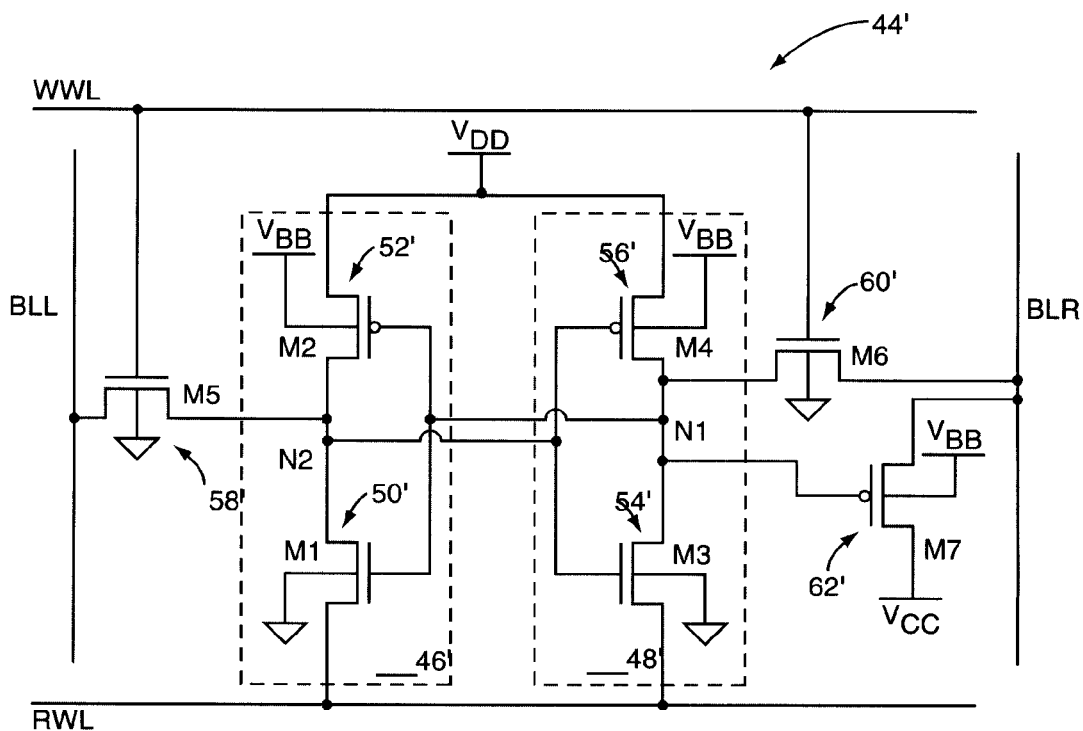
Figure 20:
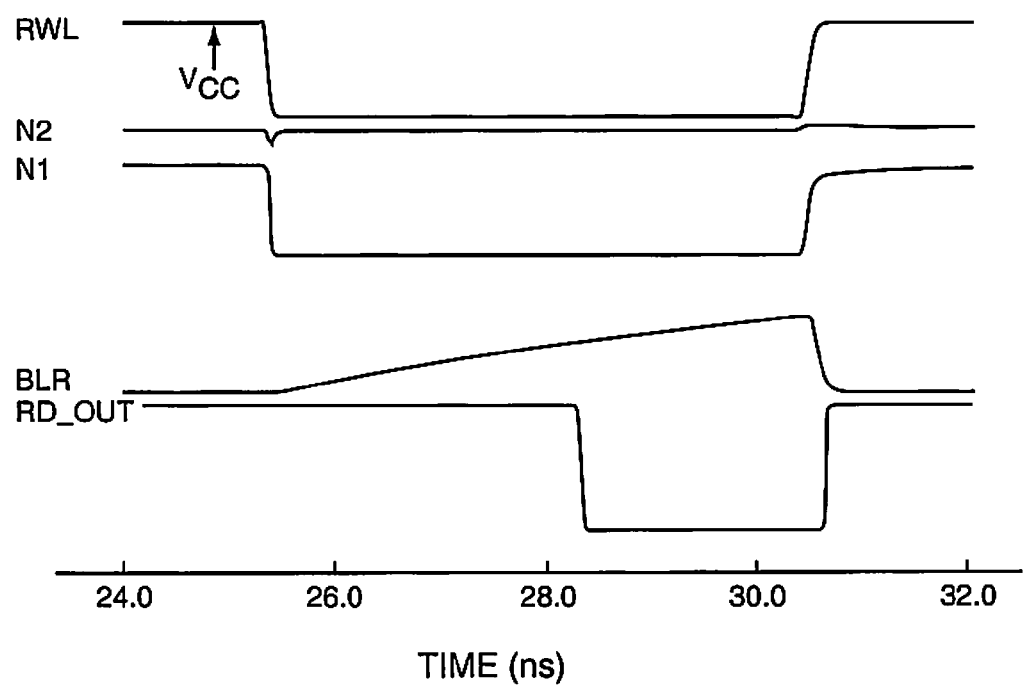

FIG. 5 illustrates a butterfly curve for the 6-T LCSRAM of FIG. 3 showing the improved Static Noise Margin (SNM) of the 6-T LCSRAM during a read operation as compared to the SNM of a conventional 6-T SRAM cell and a butterfly curve showing the SNM of the 6-T LCSRAM cell during standby;

FIG. 6 is a timing diagram illustrating a write operation for the 6-T LCSRAM cell of FIG. 3 according to one embodiment of the present invention;

FIG. 7 illustrates an exemplary embodiment of the sense amplifier of FIG. 3;

FIG. 8 illustrates a 6-T LCSRAM similar to that of FIG. 3 having an optimized layout;

FIG. 9 illustrates a 7-T LCSRAM cell according to a second embodiment of the present invention;

FIG. 10 is a timing diagram illustrating a read operation for the 7-T LCSRAM cell of FIG. 9 according to one embodiment of the present invention;

FIG. 11 is a timing diagram illustrating a write operation for the 7-T LCSRAM cell of FIG. 9 according to one embodiment of the present invention;

FIG. 12 illustrates an exemplary embodiment of a sense amplifier for the 7-T LCSRAM cell of FIG. 9;

FIG. 13 illustrates a 7-T LCSRAM cell according to a third embodiment of the present invention;

FIG. 14 is a timing diagram illustrating a read operation for the 7-T LCSRAM of FIG. 13 according to one embodiment of the present invention;

FIG. 15 is a timing diagram illustrating a write operation for the 7-T LCSRAM cell of FIG. 13 according to one embodiment of the present invention;

FIG. 16 illustrates a modified 7-T LCSRAM cell according to a fourth embodiment of the present invention;

FIG. 17 is a timing diagram illustrating a read operation of the modified 7-T LCSRAM cell of FIG. 16 according to one embodiment of the present invention;

FIG. 18 illustrates an exemplary embodiment of a sense amplifier for the modified 7-T LCSRAM cell of FIG. 16;

FIG. 19 illustrates a modified 7-T LCSRAM cell according to a fifth embodiment of the present invention; and FIG. 20 is a timing diagram illustrating a read operation of the modified 7-T LCSRAM cell of FIG. 19 according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention provides a Leakage Controlled Static Random Access Memory (LCSRAM) cell having high stability and low leakage. FIG. 3 illustrates a system 12 including a six-transistor (6-T) LCSRAM cell 14 according to a first embodiment of the present invention. In general, the 6-T LCSRAM cell 14 includes a pair of cross-coupled inverters 16 and 18 similar to those in a conventional 6-T SRAM cell (see FIG. 1). The inverter 16 includes a pull-down transistor 20 and a pull-up transistor 22 connected as illustrated and has an output node N2. In this embodiment, the pull-down transistor 20 is an n-type Metal Oxide Semiconductor (NMOS) transistor, and the pull-up transistor 22 is a p-type Metal Oxide Semiconductor (PMOS) transistor. Likewise, the inverter 18 includes a pull-down transistor 24 and a pull-up transistor 26 connected as illustrated and has an output node N1. Again, in this embodiment, the pull-down transistor 24 is an NMOS transistor and the pull-up transistor 26 is a PMOS transistor. The output node N2 of the inverter 16 is coupled to the input of the inverter 18. Likewise, the output node N1 of the inverter 18 is coupled to the input of the inverter 16. The storage nodes N1 and N2 operate to differentially store a bit of data. If a logic value of "1" is stored at the output node N1, a logic value of "0" is stored at the output node N2. In contrast, if a logic value "0" is stored at the output node N1, a logic value "1" is stored at the output node N2.

A write transistor 28 and a read transistor 30 provide access to nodes N2 and N1 for write and read operations, respectively. In this embodiment, the write transistor 28 is an NMOS transistor and is controlled by a write word line (WWL) signal. Note that the WWL signal may also be used to control write transistors of a number of associated LCSRAM cells, where the 6-T LCSRAM cell 14 and the associated LCSRAM cells collectively store a digital word. The WWL signal is provided by a driver 32 such that the WWL signal is substantially equal to a voltage level of a high voltage source ($V_{DD}$) during a write operation and otherwise substantially equal to a voltage level of a low voltage source ($V_{SS}$). For example, in one embodiment, $V_{DD}$ may be 1.2V, and $V_{SS}$ may be 0.3V. The write transistor 28 is controlled by the WWL signal to enable access to the output node N2 of the 6-T LCSRAM cell 14 from a write bit line (WBL) during write operations.

In this embodiment, the read transistor 30 is an NMOS transistor and is connected in a common source configuration. Unlike the access transistors of the conventional 6-T SRAM cell of FIG. 1, the gate of the read transistor 30 is coupled to the output node N1 of the 6-T LCSRAM cell 14. As a result, the read operation is completely decoupled from the stability of the 6-T LCSRAM cell 14, and the Static Noise Margin (SNM) of the 6-T LCSRAM cell 14 is substantially improved as compared to that of the conventional 6-T SRAM cell. In this embodiment, a drain of the read transistor 30 is connected to a read bit line (RBL), a source of the read transistor 30 is connected to the low voltage source ($V_{CC}$), and a body, or bulk, connection of the read transistor 30 is connected to ground.

The system 12 also includes transistors 34, 36, and 38. As discussed below, the transistors 34 and 36 operate to charge the write bit line (WBL) according to a data bit to be written to the 6-T LCSRAM cell 14 for a write operation. The transistor 34 is controlled by a pre-charge control (PCHN) signal that is asserted low for either a read or write operation in order to enable charging of the write bit line (WBL), and the transistor 36 is controlled based on a combined write enable and clock signal (WRENN) and a data signal (DATAN), which are combined by an AND gate 39, to either enable or disable charging of the write bit line (WBL) according to the data bit desired to be written to the 6-T LCSRAM cell 14. As such, in this embodiment, the write bit line (WBL) is pre-charged to a voltage level substantially equal to that of the high voltage source ($V_{DD}$) when a logic "1" is desired to be written to the output node N2 of the 6-T LCSRAM cell 14 and discharged to substantially ground when a logic "0" is desired to be written to the output node N2 of the 6-T LCSRAM cell 14.

The transistor 38 is controlled by the PCHN signal to pre-charge the read bit line (RBL) to substantially $V_{DD}$ prior to performing a read operation. In this embodiment, as discussed below, an inverting sense amplifier 40 may be coupled to the read bit line (RBL) and operate to provide a logic "1" or a logic "0" at a read output (RD_OUT) of the system 12 depending on whether a logic "1" or a logic "0" is read from the output node N1. The inverting sense amplifier 40 may be any type of sense amplifier such as a static sense amplifier or a dynamic sense amplifier, as will be appreciated by one of ordinary skill in the art upon reading this disclosure.

In order to reduce the leakage current, or leakage power, of the 6-T LCSRAM cell 14, the 6-T LCSRAM cell 14 is forced to a voltage collapsed state that retains the stored data bit during standby. More specifically, power is provided to the 6-T LCSRAM cell 14 via a read word line (RWL) signal. Note that the RWL signal may be used to power the 6-T LCSRAM cell 14 and a number of associated LCSRAM cells that collectively store a word of digital data. In this embodiment, the RWL signal is applied to the sources of the pull-up transistors 22 and 26 and, therefore, operates to power the 6-T LCSRAM cell 14. A driver 42 is controlled such that the RWL signal is driven or pulled to the high voltage source ($V_{DD}$) during active operation and driven or pulled to the low voltage source ($V_{CC}$) during an inactive or standby mode. As such, the 6-T LCSRAM cell 14 operates in a voltage collapsed state during standby, and a full-voltage state during active operation.

The voltage level of the low voltage source ($V_{CC}$) is such that the bit stored by the 6-T LCSRAM cell 14 is not lost during the standby mode. In one embodiment, the voltage across the inverters 16 and 18 must be at least 0.3V in order to retain the stored bit. Thus, since supply voltage ($V_{SS}$) is ground in this example, $V_{CC}$ is 0.3V. However, $V_{CC}$ may be any voltage equal to or greater than 0.3V and less than $V_{DD}$. Thus, if, for example, a logic "1" is stored at the output node N1, the voltage level at the output node N1 is approximately $V_{DD}$ when the 6-T LCSRAM cell 14 is in the full-voltage state and approximately 0.3V when the 6-T LCSRAM cell 14 is in the voltage collapsed state.

The leakage current, or leakage power, of the 6-T LCSRAM cell 14, is further reduced by reverse body biasing the pull-up transistors 22 and 26. More specifically, by connecting the bodies, or bulks, of the pull-up transistors 22 and 26 to the high voltage source ($W_D$), reverse body biasing is applied to the pull-up transistors 22 and 26 during standby when operating in the voltage collapsed state. Reverse body biasing adjusts the threshold voltage for the pull-up transistors 22 and 26 such that the leakage current for the pull-up transistors 22 and 26, and more specifically the source to drain leakage currents of the pull-up transistors 22 and 26, is substantially reduced.

Figure 4:
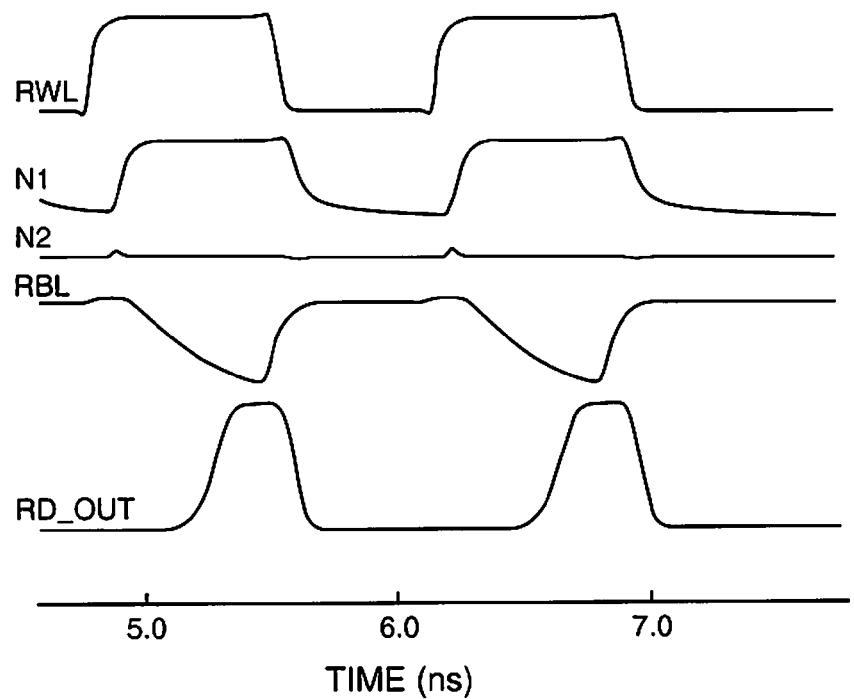
FIG. 4 is a timing diagram illustrating a read operation for the 6-T LCSRAM of FIG. 3 according to one embodiment of the present invention.

FIG. 4 is a timing diagram illustrating two successive read operations for the 6-T LCSRAM cell 14 of FIG. 3. In order to perform a read operation, the read bit line (RBL) is pre-charged to $V_{DD}$, and the driver 42 is controlled such that the RWL signal is pulled to $V_{DD}$ to transition the 6-T LCSRAM cell 14 from the standby mode to the active mode. In this example, a logic "1" is stored at the output node N1. Thus, when in standby mode, the voltage at the output node N1 is approximately $V_{CC}$ and is insufficient to turn on the read transistor 30. When the RWL signal is pulled to $V_{DD}$, the voltage at the output node N1 is also pulled up to $V_{DD}$ to provide a logic "1." The logic "1" at the output node N1 turns on the read transistor 30, and, as a result, the read bit line (RBL) is discharged to the low voltage source ($V_{CC}$) through the read transistor 30. In order to make the read output (RD_OUT) consistent with the bit value stored at the output node N1, the inverting sense amplifier 40 may optionally be used to invert the read bit line (RBL) to provide a logic "1" at the read output (RD_OUT).

Figure 1:
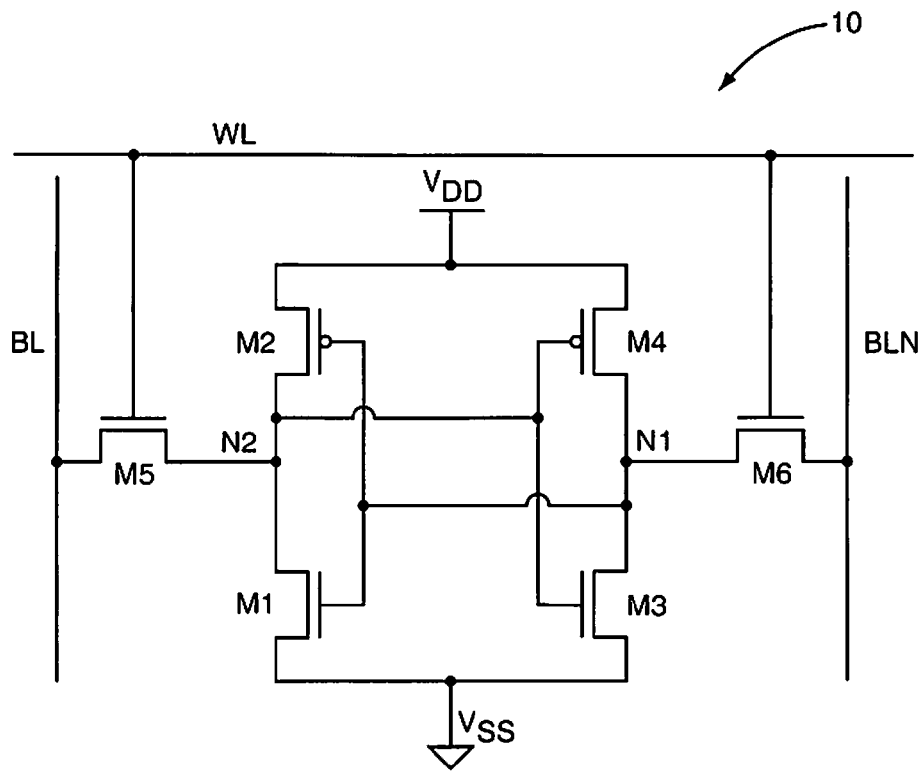
Figure 2:
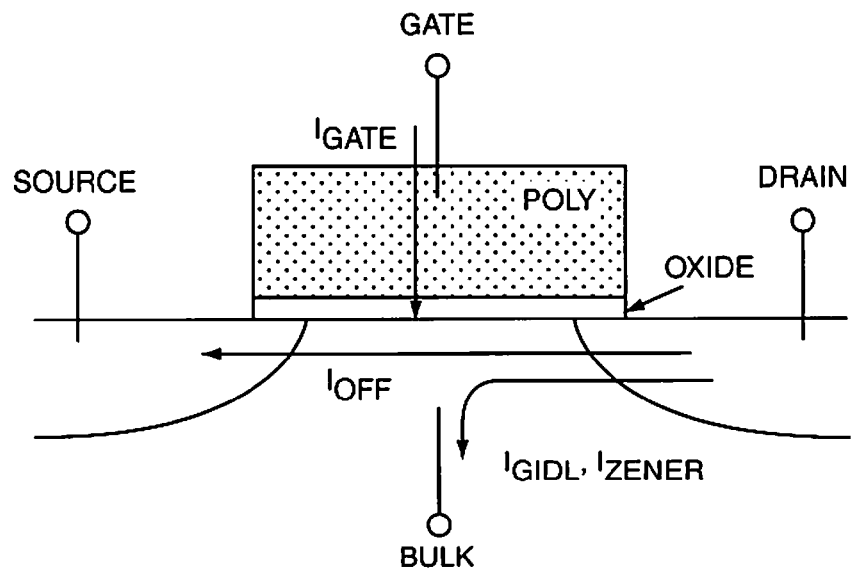
FIG. 2 illustrates leakage components in a Metal Oxide Semiconductor (MOS) transistor.

FIG. 5 illustrates a butterfly curve for the 6-T LCSRAM cell 14 during a read operation and during standby. As illustrated, the SNM of the 6-T LCSRAM cell 14 during the read operation, and thus the stability of the 6-T LCSRAM cell 14 during the read operation, is substantially greater than that of the conventional 6-T SRAM cell (FIG. 1). The butterfly curve for standby shows that the 6-T LCSRAM cell 14 has sufficient SNM when operating in standby mode to retain the stored bit of data. This standby SNM may be adjusted by changing the $V_{CC}$ supply potential.

FIG. 6 is a timing diagram illustrating a write operation for the 6-T LCSRAM cell 14 of FIG. 3. The logic value to be written to the output node N2, which in this case is a logic "0," is put onto the write bit line (WBL), and the WWL signal is pulled high in order to activate the write transistor 28. As a result, the output node N2 is forced to logic "0." Optionally, in order to quickly update the output node N1, the RWL signal is pulled to $V_{DD}$ shortly after the WWL signal is asserted. In one embodiment, the RWL signal is pulled to $V_{DD}$ approximately 250 picoseconds (ps) after the WWL signal is asserted. Once the RWL signal is pulled to $V_{DD}$, the logic "0" at the input of the inverter 18 from the output node N2 forces the output node N1 to a logic "1," thereby completing the write operation. Note that if the RWL signal is not asserted, the write operation will still complete, but require more time. However, the RWL assertion may still be required to avoid contention between RWL and the BL write driver.

FIG. 7 illustrates an exemplary embodiment of the inverting sense amplifier 40 of FIG. 3. In this example, the inverting sense amplifier 40 is shared by two rows of LCSRAM cells, which are referred to herein as a top row and a bottom row. The top row of LCSRAM cells share the read bit line (RBL_TOP), and the bottom row of the LCSRAM cells share the read bit line (RBL_BOT). The inverting sense amplifier 40 is enabled by an enable signal (SA_SELN). As will be appreciated by one of ordinary skill in the art, when enabled, the inverting sense amplifier 40 operates to provide a logic "1" at the read output (RD_OUT) when one of the read bit lines (RBL_TOP, RBL_BOT) is discharged to the low voltage level and otherwise provides a logic "0."

FIG. 8 illustrates another embodiment of the 6-T LCSRAM cell 14' having a more optimized layout. More specifically, in this embodiment, both the write transistor 28 and the read transistor 30 are connected to the output storage node N1 and share a single bit line (BL). As a result, the layout of the 6-T LCSRAM cell 14' is optimized such that the 6-T LCSRAM cell 14' occupies approximately the same die area as the conventional 6-T SRAM cell. In order to prevent a DC short circuit from the single bit line (BL) through the read transistor 30 back to the single bit line (BL) when writing a logic "1" to the output node N1, a tri-state driver is implemented on the single bit line (BL). Thus, when writing a logic "1" to the 6-T LCSRAM cell 14', the single bit line (BL) is driven to the voltage level of the high voltage source ($V_{DD}$) and then the single bit line (BL) is tri-stated. The WWL signal is then asserted to activate the write transistor 28 in order to write a logic "1" to the output node N1. The RWL signal is then asserted, or pulled to $V_{DD}$, such that the single bit line (BL) is discharged to the low voltage source ($V_{CC}$) through the read transistor 30.

FIG. 9 illustrates a 7-T LCSRAM cell 44 according to another embodiment of the present invention. In general, the 7-T LCSRAM cell 44 is substantially the same as the 6-T LCSRAM cell 14 of FIG. 3 with the addition of another write transistor enabling data to be written to the 7-T LCSRAM cell 44 differentially. More specifically, the 7-T LCSRAM cell 44 includes a pair of cross-coupled inverters 46 and 48. The inverter 46 includes a pull-down transistor 50 and a pull-up transistor 52 connected as illustrated and has an output node N2. In this embodiment, the pull-down transistor 50 is an NMOS transistor, and the pull-up transistor 52 is a PMOS transistor. Likewise, the inverter 48 includes a pull-down transistor 54 and a pull-up transistor 56 connected as illustrated and has an output node N1, where, in this embodiment, the pull-down transistor 54 is an NMOS transistor and the pull-up transistor 56 is a PMOS transistor. The output node N2 of the inverter 46 operates to drive, or is coupled to the input of, the inverter 48. Likewise, the output node N1 of the inverter 48 operates to drive, or is coupled to the input of, the inverter 46. The output nodes N1 and N2 operate to differentially store a bit of data.

Write transistors 58 and 60 provide access to the output nodes N2 and N1 from left and right bit line (BLL, BLR), respectively, to enable data to be written to the 7-T LCSRAM cell 44. In this embodiment, the write transistors 58 and 60 are PMOS transistors and are controlled by a WWL signal. The WWL signal is provided by a driver such that the WWL signal is substantially equal to a source voltage ($V_{SS}$) or some other low voltage during write operation, thereby enabling data to be written to the 7-T LCSRAM cell 44 via the write transistors 58 and 60. When not in write mode, the driver provides the WWL signal such that the WWL signal is substantially equal to a high voltage such as $V_{DD}$.

A read transistor 62, which in this embodiment is an NMOS transistor, operates to decouple the read operation from the stability of the 7-T LCSRAM cell 44 in a manner similar to the read transistor 30 of FIG. 3. As a result, the SNM of the 7-T LCSRAM cell 44 is substantially improved as compared to that of the conventional 6-T SRAM cell. Like the read transistor 30, the read transistor 62 is connected to the output node N1 via its gate. However, rather than being connected in a common source configuration, the read transistor 62 is connected in a source-follower, or common drain, configuration where a drain of the read transistor 62 is connected to the RWL signal and a source of the read transistor 62 is connected to the right bit line (BLR).

Again, in order to reduce the leakage current, or leakage power, of the 7-T LCSRAM cell 44, reverse body biasing is applied to the pull-up transistors 52 and 56 by connecting the bodies, or bulks, of the pull-up transistors 52 and 56 to the $V_{DD}$, which may be, for example, 1.2V. The leakage current of the 7-T LCSRAM cell 44 is further reduced by forcing the 7-T LCSRAM cell 44 to a collapsed voltage state during standby. More specifically, in this embodiment, the RWL signal is applied to the sources of the pull-up transistors 52 and 56 and, therefore, operates to power the 7-T LCSRAM cell 44. The RWL signal is controlled to be substantially equal to $V_{DD}$ during active operation and substantially equal to $V_{CC}$ during an inactive or standby mode. Again, the voltage level of the $V_{CC}$ is such that the bit stored by the 7-T LCSRAM cell 44 is not lost during the standby mode. For example, $V_{CC}$ may be 0.3V such that a 0.3V differential is maintained across the inverters 46 and 48, where 0.3V is the minimum voltage needed to maintain the data bit stored by the 7-T LCSRAM cell 44.

FIG. 10 is a timing diagram illustrating an exemplary read operation for the 7-T LCSRAM cell 44 of FIG. 9. The right bit line (BLR) is pre-discharged low, and the RWL signal is pulled to $V_{DD}$. Note that the WWL signal is also pulled high to, for example, $V_{DD}$ such that the write transistors 58 and 60 are inactive. In this example, a logic value "1" is stored at the output node N1. As such, the read transistor 62 is turned on and operates to pull the right bit line (BLR) to a voltage level approximately equal to $V_{DD}-V_{tN}$, where $V_{tN}$ is the threshold voltage of the read transistor 62. The voltage level of the right bit line (BLR) therefore corresponds to a logic "1." The read transistor 62 may be implemented as a low voltage transistor having a threshold voltage $V_{tNL}$ that is less than $V_{tN}$ in order to further increase the voltage level of the right bit line (BLR) when reading a logic "1." If desired, a non-inverting sense amplifier or some latch device may then be used to sense the voltage level of the right bit line (BLR) to provide a read output (RD_OUT) for the 7-T LCSRAM cell 44. In contrast, if a logic "0" were stored at the output node N1, the read transistor 62 would remain off and the right bit line (BLR) would remain at the discharged voltage level, which corresponds to a logic "0."

FIG. 11 is a timing diagram illustrating an exemplary write operation for the 7-T LCSRAM cell 44 of FIG. 9. First, the left and right bit lines (BLL and BLR) are driven high or low depending on the desired data bit to be written to the 7-T LCSRAM cell 44. In this example, the left bit line (BLL) is driven high to $V_{DD}$, and the right bit line (BLR) is driven low to $V_{CC}$. The RWL signal is pulled to $V_{DD}$, and the WWL signal is pulled low. As a result, the desired data is written from the left and right bit lines (BLL and BLR) to the 7-T LCSRAM cell 44 via the write transistors 58 and 60.

FIG. 12 illustrates an exemplary sense amplifier for sensing the right bit line (BLR) to provide the read output (RD_OUT) during read operations. In general, the sense amplifier is a pulse-clocked sense amplifier latch driven by a clock signal (PCLK, PCLKN). The operation of the sense amplifier will be apparent to one of ordinary skill in the art upon reading this disclosure. In general, the sense amplifier operates to output a logic "1" upon detecting charging of input right bit line (BLR) to a threshold level and to otherwise output a logic "0." In the example above, the threshold level is substantially equal slightly less than $V_{DD}-V_{tN}$ or $V_{DD}-V_{tNL}$.

FIG. 13 illustrates another embodiment of the 7-T LCSRAM cell 44' that is similar to that illustrated in FIG. 9. However, in this embodiment, reverse body biasing is applied to the pull-down transistors 50' and 54' and the pull-up transistors 52' and 56' rather than just the pull-up transistors 52' and 56'. As a result, the leakage current is significantly reduced as compared to the leakage current of the 7-T LCSRAM cell 44 of FIG. 9.

More specifically, in this embodiment, the 7-T LCSRAM cell 44' is still powered by the RWL signal. However, the RWL signal is coupled to the sources of the pull-down transistors 50' and 54' rather than the sources of the pull-up transistors 52' and 56'. As such, the RWL signal is pulled low to, for example, $V_{SS}$ when reading or writing and pulled high to, for example, $V_{CC}$ when in standby mode. In this example, $V_{SS}$ is ground, $V_{CC}$ is 0.9V, and $V_{DD}$ is 1.2V. However, the present invention is not limited thereto. As such, a voltage sufficient to retain the stored bit is maintained across the inverters 46' and 48' during standby. The bodies of the pull-down transistors 50' and 54' are connected to $V_{SS}$ such that reverse body biasing is applied to the pull-down transistors 50' and 54' during standby. The sources of the pull-up transistors 52' and 56' are connected to $V_{DD}$. The bodies of the pull-up transistors 52' and 56' are connected to a voltage $V_{BB}$, which in this example is 1.8V. Thus, reverse body biasing is also applied to the pull-up transistors 52' and 56'.

In this embodiment, the write transistors 58' and 60' are NMOS transistors. As such, the WWL signal is driven high during write operations and is otherwise driven low. The read transistor 62' is a PMOS transistor and is connected to the output node N1 in a source-follower configuration. Again, the gate of the read transistor 62' is connected to the output node N1 such that the read operation is decoupled from the stability of the 7-T LCSRAM 44' cell during read operations. The body of the read transistor 62' is connected to $V_{BB}$.

FIG. 14 is a timing diagram illustrating an exemplary read operation for the 7-T LCSRAM cell 44' of FIG. 13. The right bit line (BLR) is pre-charged to $V_{CC}$. Then, the RWL signal is asserted, or pulled low to $V_{SS}$, in order to activate the 7-T LCSRAM cell 44' for the read operation. In this example, a logic "0" is stored at the output node N1. As such, the read transistor 62', which is a PMOS transistor, is turned on, and the right bit line (BLR) is discharged to $V_{SS}$ via the read transistor 62'. More specifically, since $V_{SS}$ is ground in this example, the right bit line (BLR) is discharged to a voltage level approximately equal to $V_{tP}$, where $V_{tP}$ is the threshold voltage of the read transistor 62'. A non-inverting sense amplifier or latch device may be used to sense the voltage level of the read bit line (RBL) to provide a logic "0" at a read output (RD_OUT) for the 7-T LCSRAM cell 44'.

FIG. 15 is a timing diagram illustrating an exemplary write operation for the 7-T LCSRAM cell 44' of FIG. 13. First, the left and right bit lines (BLL and BLR) are driven to the desired value depending on the data bit to be written to the 7-T LCSRAM cell 44'. In this example, the left bit line (BLL) is driven to $V_{CC}$, and the right bit line (BLR) is driven to $V_{SS}$. The WWL signal is pulled high to $V_{DD}$, and the RWL signal is pulled low to $V_{SS}$ in order to initiate the write operation. Once the write operation is initiated, the desired data bit is written to the 7-T LCSRAM cell 44' via the write transistors 58' and 60' and stored differentially at the output nodes N1 and N2.

Due to the source-follower configuration of the read transistor 62, 62' of the 7-T LCSRAM cell 44, 44' described above, the read operation of the 7-T LCSRAM cell 44, 44' is slower than that of the 6-T LCSRAM cell 14 of FIG. 3 where the read transistor 30 is connected in a common source configuration. FIG. 16 illustrates another embodiment of the 7-T LCSRAM cell 44 wherein the read transistor 62 is connected in common source configuration in the same manner as the read transistor 30 of the 6-T LCSRAM cell 14 of FIG. 3. As a result, the speed of the read operation of the 7-T LCSRAM cell 44 is substantially increased.

FIG. 17 is a timing diagram illustrating an exemplary read operation for the modified 7-T LCSRAM cell 44 of FIG. 16. First, the right bit line (BLR) for the read operation is pre-charged to $V_{DD}$. The read access is initiated by asserting the RWL signal from $V_{CC}$ to $V_{DD}$. Consequently, the right bit line (BLR) discharges down to $V_{CC}$ or remains at $V_{DD}$ depending on data bit stored in the 7-T LCSRAM cell 44. In the illustrated example, a logic "1" is stored at the output node N1. As such, the read transistor 62 is turned on, and the right bit line (BLR) is discharged from $V_{DD}$ to $V_{CC}$ through the read transistor 62. Again, an inverting sense amplifier may be used to sense the voltage level on the right bit line (BLR) to provide a logic value at a read output (RD_OUT) for the 7-T LCSRAM cell 44 that corresponds to the logic value stored at the output node N1.

FIG. 18 illustrates an exemplary sense amplifier for sensing the right bit line (BLR) of the modified 7-T LCSRAM cell 44 of FIG. 16. The operation of the sense amplifier will be apparent to one of ordinary skill in the art upon reading this disclosure. In general, the sense amplifier is enabled by a read enable signal (RDEN, RDENN) and operates to output a logic "0" when the right bit line (BLR) is above a voltage threshold and to output a logic "1" when the right bit line (BLR) is below the voltage threshold.

FIG. 19 illustrates another embodiment of the 7-T LCSRAM cell 44' wherein the read transistor 62' is connected in common source configuration in a manner similar to that of the read transistor 30 of the 6-T LCSRAM cell 14 of FIG. 3. Since the read transistor 62' is connected in a common source configuration rather than a source-follower configuration, the speed of the read operation of the 7-T LCSRAM cell 44' is substantially increased.

FIG. 20 is a timing diagram illustrating an exemplary read operation for the modified 7-T LCSRAM cell 44' of FIG. 16. First, the right bit line (BLR) is pre-discharged to $V_{SS}$. The read is initiated by asserting the RWL signal from $V_{CC}$ to $V_{SS}$. In this example, a logic "0" is stored at the output node N1. As a result, the read transistor 62', which is a PMOS transistor, is turned on, and the right bit line (BLR) is pulled to $V_{CC}$ via the read transistor 62'. An inverting sense amplifier may be used to sense this rise in the right bit line (BLR) to provide the desired logic "0" at the read output (RD_OUT) for the 7-T LCSRAM cell 44'. In contrast, if a logic "1" is stored at the output node N1, the read transistor 62' remains off, and the right bit line (BLR) remains discharged. The inverting sense amplifier then provides the desired logic "1" at the read output (RD_OUT).

Those skilled in the art will recognize improvements and modifications to the preferred embodiments of the present invention. All such improvements and modifications are considered within the scope of the concepts disclosed herein and the claims that follow.

What is claimed is:

1. A Static Random Access Memory (SRAM) cell comprising:
    a pair of cross-coupled inverters having a first output node and operating to store a data bit at the first output node, the pair of cross-coupled inverters powered by a read control signal to operate in a voltage-collapsed state during standby and in a full-voltage state during read operations;
    a read transistor comprising a gate coupled to the first output node of the pair of cross-coupled inverters and operating to provide a signal indicative of the data bit on a first bit line during the read operations; and
    a write transistor comprising a source, a drain, and a gate and having one of the source and the drain connected to the first output node of the pair of cross-coupled inverters and an other of the source and the drain coupled to the first bit line, wherein the write transistor is controlled via the gate of the write transistor such that a desired data bit is written from the first bit line to the pair of cross-coupled inverters via the write transistor during write operations.

2. The SRAM cell of claim 1 wherein the read transistor is a n-type transistor and one of a source and a drain of the read transistor is coupled to the first bit line and an other of the source and the drain of the read transistor is coupled to a low voltage source.

3. The SRAM cell of claim 1 wherein the read transistor is a p-type transistor and one of a source and a drain of the read transistor is coupled to the first bit line and an other of the source and the drain of the read transistor is coupled to a high voltage source.

4. The SRAM cell of claim 1 wherein the read transistor is a n-type transistor and one of a source and a drain of the read transistor is coupled to the first bit line and an other of the source and the drain of the read transistor is adapted to receive the read control signal.

5. The SRAM cell of claim 1 wherein the pair of cross-coupled inverters comprises:
   a first inverter comprising:
      a first pull-up transistor having a gate coupled to a second output node of the pair of cross-coupled inverters, a source adapted to receive the read control signal, a drain coupled to the first output node, and a body coupled to a first voltage source; and
      a first pull-down transistor having a gate coupled to the second output node, a source coupled to a second voltage source, and a drain coupled to the first output node; and
   a second inverter comprising:
      a second pull-up transistor having a gate coupled to the first output node, a source adapted to receive the read control signal, a drain coupled to the second output node, and a body coupled to the first voltage source; and
      a second pull-down transistor having a gate coupled to the first output node, a source coupled to the second voltage source, and a drain coupled to the second output node.

6. The SRAM cell of claim 5 wherein a voltage level of the first voltage source is such that reverse body biasing is applied to the first and second pull-up transistors during standby.

7. The SRAM cell of claim 5 wherein the first and second pull-up transistors are p-type Metal Oxide Semiconductor (PMOS) transistors, and the first and second pull-down transistors are n-type Metal Oxide Semiconductor (NMOS) transistors.

8. The SRAM cell of claim 5 wherein the read control signal is provided at a first voltage level during active operation and at a reduced voltage level during standby.

9. The SRAM cell of claim 8 wherein the reduced voltage level is such that a voltage differential between the reduced voltage level provided to the sources of the first and second pull-up transistors and a voltage level of the second voltage source provided to the sources of the first and second pull-down transistors is greater than or equal to a threshold voltage needed to maintain the data bit stored by the pair of cross-coupled inverters during standby.

10. The SRAM cell of claim 8 wherein one of a source and drain of the read transistor is coupled to the first bit line and an other of the source and drain of the read transistor is coupled to a low level voltage source.

11. The SRAM cell of claim 10 wherein, in order to read the data bit stored by the pair of cross-coupled inverters, the first bit line is pre-charged to a charged voltage level and the read control signal is asserted to the first voltage level such that the first bit line is discharged to substantially a voltage level of the low level voltage source through the read transistor if the data bit is a first logic value and remains at the charged voltage level if the data bit is a second logic value.

12. The SRAM cell of claim 8 further comprising a second write transistor wherein one of a source and a drain of the second write transistor is coupled to a second bit line, an other of the source and the drain of the second write transistor is coupled to the second output node, and a gate of the second write transistor is adapted to receive a write control signal.

13. The SRAM cell of claim 12 wherein, in order to write a new data bit to the pair of cross-coupled inverters, the second bit line is driven to a voltage level corresponding to the new data bit and the write control signal is asserted such that the second bit line is coupled to the second output node via the second write transistor.

14. The SRAM cell of claim 13 wherein the read control signal is asserted to the first voltage level when writing the new data bit to the pair of cross-coupled inverters.

15. The SRAM cell of claim 8 wherein the source of the write transistor is coupled to the first bit line, the drain of the write transistor is coupled to the first output node, and the gate of the write transistor is adapted to receive a write control signal.

16. The SRAM cell of claim 15 wherein, in order to write a new data bit to the pair of cross-coupled inverters, the first bit line is driven to a voltage level corresponding to the new data bit and the write control signal is asserted such that the first bit line is coupled to the first output node via the write transistor.

17. The SRAM cell of claim 16 wherein the read control signal is asserted to the first voltage level when writing the new data bit to the pair of cross-coupled inverters.

18. The SRAM cell of claim 8 wherein:
   the write transistor is configured such that the gate of the write transistor is adapted to receive a write control signal, one of the source and the drain of the write transistor is coupled to the first output node, and the other of the source and the drain of the write transistor is coupled to the first bit line; and
   the SRAM cell further comprises a second write transistor comprising a gate, a source, and a drain and configured such that the gate of the second write transistor is adapted to receive the write control signal, one of the source and drain of the second write transistor is coupled to the second output node, and the other of the source and drain of the first write transistor is coupled to a second bit line;
wherein the read transistor is configured such that the gate of the read transistor is coupled to the first output node, one of a source and a drain of the read transistor is coupled to the first bit line, and an other of the source and the drain of the read transistor is adapted to receive the read control signal.

19. The SRAM cell of claim 18 wherein, in order to read the data bit stored by the pair of cross-coupled inverters, the first bit line is pre-discharged to a discharged voltage level and the read control signal is asserted to the first voltage level such that the first bit line is pulled to substantially the first voltage level through the read transistor if the data bit is a first logic value and remains at the discharged voltage level if the data bit is a second logic value.

20. The SRAM cell of claim 18 wherein, in order to write a new data bit to the pair of cross-coupled inverters, the first and second bit lines are driven to voltage levels corresponding to the new data bit and the write control signal is asserted such that the first bit line is coupled to the first output node via the first write transistor and the second bit line is coupled to the second output node via the second write transistor in order to differentially write the new data bit to the first and second output nodes of the pair of cross-coupled inverters.

21. The SRAM cell of claim 20 wherein the read control signal is asserted to the first voltage level when writing the new data bit to the pair of cross-coupled inverters.

22. The SRAM cell of claim 8 wherein:
   the write transistor is configured such that the gate of the write transistor is adapted to receive a write control signal, one of the source and the drain of the write transistor is coupled to the first output node, and the other of the source and the drain of the write transistor is coupled to the first bit line; and the SRAM cell further comprises a second write transistor comprising a gate, a source, and a drain and configured such that the gate of the second write transistor is adapted to receive the write control signal, one of the source and the drain of the second write transistor is coupled to the second output node, and the other of the source and drain of the second write transistor is coupled to a second bit line;

wherein the read transistor is configured such that the gate of the read transistor is coupled to the first output node, one of a source and a drain of the read transistor is coupled to the first bit line, and an other of the source and drain of the read transistor is coupled to a low level voltage source.

23. The SRAM cell of claim 22 wherein, in order to read the data bit stored by the pair of cross-coupled inverters, the first bit line is pre-charged to a charged voltage level and the read control signal is asserted to the first voltage level such that the first bit line is discharged to the low level voltage source via the read transistor if the data bit is a first logic value and remains at the charged voltage level if the data bit is a second logic value.

24. The SRAM cell of claim 22 wherein, in order to write a new data bit to the pair of cross-coupled inverters, the first and second bit lines are driven to voltage levels corresponding to the new data bit and the write control signal is asserted such that the first bit line is coupled to the first output node via the first write transistor and the second bit line is coupled to the second output node via the second write transistor in order to differentially write the new data bit to the first and second output nodes of the pair of cross-coupled inverters.

25. The SRAM cell of claim 24 wherein the read control signal is asserted to the first voltage level when writing the new data bit to the pair of cross-coupled inverters.

26. A Static Random Access Memory (SRAM) cell comprising:
a pair of cross-coupled inverters having a first output node and operating to store a data bit at the first output node, the pair of cross-coupled inverters powered by a read control signal to operate in a voltage-collapsed state during standby and in a full-voltage state during read operations;
a read transistor comprising a gate coupled to the first output node of the pair of cross-coupled inverters and operating to provide a signal indicative of the data bit on a first bit line during the read operations; and
wherein the pair of cross-coupled inverters comprises:
a first inverter comprising:
a first pull-up transistor having a gate coupled to a second output node of the pair of cross-coupled inverters, a source coupled to a first voltage source, a drain coupled to the first output node, and a body coupled to a second voltage source; and
a first pull-down transistor having a gate coupled to the second output node, a source adapted to receive the read control signal, a drain coupled to the first output node, and a body coupled to a third voltage source; and
a second inverter comprising:
a second pull-up transistor having a gate coupled to the first output node, a source coupled to the first voltage source, a drain coupled to the second output node, and a body coupled to the second voltage source; and
a second pull-down transistor having a gate coupled to the first output node, a source adapted to receive the read control signal, a drain coupled to the second output node, and a body coupled to the third voltage source.

27. The SRAM cell of claim 26 wherein a voltage level of the second voltage source is such that reverse body biasing is applied to the first and second pull-up transistors, and a voltage level of the third voltage source is such that reverse body biasing is applied to the first and second pull-down transistors during standby.

28. The SRAM cell of claim 26 wherein the first and second pull-up transistors are p-type Metal Oxide Semiconductor (PMOS) transistors, and the first and second pull-down transistors are n-type Metal Oxide Semiconductor (NMOS) transistors.

29. The SRAM cell of claim 26 wherein the read control signal is provided at a first voltage level during active operation and at an increased voltage level during standby.

30. The SRAM cell of claim 29 wherein the increased voltage level is provided such that a voltage differential between a voltage level of the first voltage source provided to the sources of the first and second pull-up transistors and the increased voltage level provided to the sources of the first and second pull-down transistors is greater than or equal to a threshold voltage needed to maintain the data bit stored by the pair of cross-coupled inverters during standby.

31. The SRAM cell of claim 29 further comprising:
a first write transistor comprising a gate, a source, and a drain and configured such that the gate of the first write transistor is adapted to receive a write control signal, one of the source and the drain of the first write transistor is coupled to the first output node, and the other of the source and the drain of the first write transistor is coupled to the first bit line; and
a second write transistor comprising a gate, a source, and a drain and configured such that the gate of the second write transistor is adapted to receive the write control signal, one of the source and the drain of the second write transistor is coupled to the second output node, and the other of the source and the drain of the second write transistor is coupled to a second bit line;
wherein the read transistor is configured such that the gate of the read transistor is coupled to the first output node, one of a source and a drain of the read transistor is coupled to the first bit line, and an other of the source and the drain of the read transistor is adapted to receive the read control signal.

32. The SRAM cell of claim 31 wherein, in order to read the data bit stored by the pair of cross-coupled inverters, the first bit line is pre-charged to a charged voltage level and the read control signal is asserted to the first voltage level such that the first bit line is discharged to substantially the first voltage level through the read transistor if the data bit is a first logic value and remains at the charged voltage level if the data bit is a second logic value.

33. The SRAM cell of claim 31 wherein, in order to write a new data bit to the pair of cross-coupled inverters, the first and second bit lines are driven to voltage levels corresponding to the new data bit and the write control signal is asserted such that the first bit line is coupled to the first output node via the first write transistor and the second bit line is coupled to the second output node via the second write transistor in order to differentially write the new data bit to the first and second output nodes of the pair of cross-coupled inverters.

34. The SRAM cell of claim 33 wherein the read control signal is asserted to the first voltage level when writing the new data bit to the pair of cross-coupled inverters.

35. The SRAM cell of claim 29 further comprising:
a first write transistor comprising a gate, a source, and a drain and configured such that the gate of the first write transistor is adapted to receive a write control signal, one of the source and the drain of the first write transistor is coupled to the first output node, and the other of the source and the drain of the first write transistor is coupled to the first bit line; and
a second write transistor comprising a gate, a source, and a drain and configured such that the gate of the second write transistor is adapted to receive the write control signal, one of the source and the drain of the second write transistor is coupled to the second output node, and the other of the source and the drain of the second write transistor is coupled to a second bit line;
wherein the read transistor is configured such that the gate of the read transistor is coupled to the first output node, one of a source and a drain of the read transistor is coupled to the first bit line, and an other of the source and the drain of the read transistor is coupled to a high level voltage source.

36. The SRAM cell of claim 35 wherein, in order to read the data bit stored by the pair of cross-coupled inverters, the first bit line is pre-discharged to a discharged voltage level and the read control signal is asserted to the first voltage level such that the first bit line is pulled to substantially a voltage level of the high level voltage source via the read transistor if the data bit is a first logic value and remains at the discharged voltage level if the data bit is a second logic value.

37. The SRAM cell of claim 35 wherein, in order to write a new data bit to the pair of cross-coupled inverters, the first and second bit lines are driven to desired logic values corresponding to the new data bit and the write control signal is asserted such that the first bit line is coupled to the first output node via the first write transistor and the second bit line is coupled to the second output node via the second write transistor so that the new data bit is written to the pair of cross-coupled inverters and stored differentially at the first and second output nodes.

38. The SRAM cell of claim 37 wherein the read control signal is asserted to the first voltage level when writing the new data bit to the pair of cross-coupled inverters.

* * * * *